US011961582B2

(12) United States Patent
Shang et al.

(10) Patent No.: US 11,961,582 B2
(45) Date of Patent: *Apr. 16, 2024

(54) SHIFT REGISTER UNIT, DRIVING METHOD THEREOF, AND DEVICE

(71) Applicant: BOE Technology Group Co., Ltd., Beijing (CN)

(72) Inventors: Guangliang Shang, Beijing (CN); Xinshe Yin, Beijing (CN); Qian Yang, Beijing (CN); Libin Liu, Beijing (CN); Shiming Shi, Beijing (CN); Dawei Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/828,425

(22) Filed: May 31, 2022

(65) Prior Publication Data

US 2023/0352063 A1 Nov. 2, 2023

Related U.S. Application Data

(63) Continuation of application No. 16/767,755, filed as application No. PCT/CN2019/094451 on Jul. 2, 2019, now Pat. No. 11,380,374.

(51) Int. Cl.
*G09G 3/36* (2006.01)
*G09G 3/20* (2006.01)
(Continued)

(52) U.S. Cl.
CPC .......... *G11C 7/1036* (2013.01); *G11C 7/1063* (2013.01); *G11C 7/109* (2013.01);
(Continued)

(58) Field of Classification Search
CPC ........... G11C 7/1036–1063; G11C 7/109–222; G11C 7/14; G11C 19/28; G09G 3/3674–3677; G09G 3/20; G06F 3/044
See application file for complete search history.

(56) References Cited

U.S. PATENT DOCUMENTS

2018/0233090 A1* 8/2018 Zhang .................... G11C 19/28
2020/0013473 A1* 1/2020 Xuan ....................... G09G 3/20
(Continued)

FOREIGN PATENT DOCUMENTS

CN 106782337 A 5/2017
CN 106782413 A * 5/2017 ............... G09G 3/36
(Continued)

OTHER PUBLICATIONS

ESSR from 19933227.1 issued on Jun. 3, 2022.
Notice of Allowance issued in U.S. Appl. No. 16/767,755 dated Jun. 6, 2022.

*Primary Examiner* — Lin Li
(74) *Attorney, Agent, or Firm* — ArentFox Schiff LLP; Michael Fainberg

(57) ABSTRACT

Embodiments of the present disclosure disclose a shift register unit, a driving method thereof, and a device. The shift register unit includes an input circuit, a node control circuit, a first control output circuit, a second control output circuit and an output circuit. By providing the first control output circuit and the second control output circuit, the first control output circuit and the second control output circuit may operate alternately, so that the first control output circuit and the second control output circuit may have time for characteristics recovery respectively, thus improving the service life and output stability of the shift register unit.

18 Claims, 8 Drawing Sheets

VREF2 S2 42 43 CK1 VREF2 41 10 C3 M6 M7 M5 N5 M8 VREF1 M17 N2 M1 N4 M2 M4 31 S1 32 M3 N3 33 OUTP M14 CK2 M15 C1 INP M16 N1 20 M9 M10 CK1 50 VREF1 CK2

(51) Int. Cl.

| | |
|---|---|
| ***G11C 7/10*** | (2006.01) |
| ***G11C 7/14*** | (2006.01) |
| ***G11C 7/22*** | (2006.01) |
| ***G11C 19/28*** | (2006.01) |

(52) U.S. Cl.

CPC ................ *G11C 7/14* (2013.01); *G11C 7/222* (2013.01); *G11C 19/28* (2013.01)

(56) References Cited

U.S. PATENT DOCUMENTS

| | | | |
|---|---|---|---|
| 2020/0294461 | A1 | 9/2020 | Xu et al. |
| 2021/0358384 | A1 | 11/2021 | Liu et al. |

FOREIGN PATENT DOCUMENTS

| | | | | | |
|---|---|---|---|---|---|
| CN | 106910453 | A | | 6/2017 | |
| CN | 107192337 | A | | 9/2017 | |
| CN | 107492337 | A | * | 12/2017 | ............... G09G 3/20 |
| CN | 107863057 | A | * | 3/2018 | ............... G09G 3/20 |
| CN | 108231034 | A | * | 6/2018 | ............... G09G 3/36 |
| CN | 108777129 | A | | 11/2018 | |
| CN | 208141796 | U | | 11/2018 | |
| CN | 109817144 | A | | 5/2019 | |

* cited by examiner

SHIFT REGISTER UNIT, DRIVING METHOD THEREOF, AND DEVICE

The present application is a continuation application of U.S. patent application Ser. No. 16/767,755, filed on May 28, 2020, which is a National Stage of International Application No. PCT/CN2019/094451, filed Jul. 2, 2019, which is hereby incorporated by reference in its entirety.

FIELD

The present disclosure relates to the field of display, and particularly to a shift register unit, a driving method thereof, and a device.

BACKGROUND

With the rapid development of display technology, display devices are increasingly developing towards high integration and low cost. The GOA (Gate Driver on Array) technology integrates a TFT (Thin Film Transistor) gate drive circuit on an array substrate of a display device to achieve scan driving of the display device. The gate drive circuit is usually composed of a plurality of cascaded shift register units.

SUMMARY

An embodiment of the present disclosure provides a shift register unit. The shift register unit includes: an input circuit configured to provide a signal of an input signal terminal to a first node in response to a signal of a first clock signal terminal; and provide a signal of a first reference signal terminal to a second node in response to the signal of the first clock signal terminal; a node control circuit configured to provide the signal of the first clock signal terminal to the second node in response to a signal of the first node, and connect the first node with third node in response to a signal of a second clock signal terminal; a first control output circuit configured to control a signal of the third node according to a signal of a first control signal terminal and a signal of the second node, and provide a signal of a second reference signal terminal to a signal output terminal; a second control output circuit configured to control the signal of the third node according to a signal of a second control signal terminal and a signal of the second node, and provide the signal of the second reference signal terminal to the signal output terminal; and an output circuit configured to provide the signal of the second clock signal terminal to the signal output terminal according to the signal of the first node.

Optionally, in the embodiment of the present disclosure, the first control output circuit includes a first sub-circuit, a second sub-circuit and a third sub-circuit; the first sub-circuit is configured to connect the second node with a fourth node in response to the signal of the first control signal terminal; the second sub-circuit is configured to provide the signal of the second reference signal terminal to a fifth node in response to the signal of the first control signal terminal; and the third sub-circuit is configured to provide the signal of the second reference signal terminal to the third node and the signal output terminal respectively in response to a signal of the fourth node.

Optionally, in the embodiment of the present disclosure, the input circuit includes a first transistor; and the first transistor has a gate coupled to the first control signal terminal, a first electrode coupled to the second node, and a second electrode coupled to the fourth node.

Optionally, in the embodiment of the present disclosure, the second sub-circuit includes a second transistor; and the second transistor has a gate coupled to the first control signal terminal, a first electrode coupled to the second reference signal terminal, and a second electrode coupled to the fifth node.

Optionally, in the embodiment of the present disclosure, the third sub-circuit includes a third transistor and a fourth transistor; and the third transistor hasg a gate coupled to the fourth node, a first electrode coupled to the second reference signal terminal, and a second electrode coupled to the third node; and the fourth transistor has a gate coupled to the fourth node, a first electrode coupled to the second reference signal terminal, and a second electrode coupled to the signal output terminal.

Optionally, in the embodiment of the present disclosure, the second control output circuit includes a fourth sub-circuit, a fifth sub-circuit and a sixth sub-circuit, wherein the fourth sub-circuit is configured to connect the second node with the fifth node in response to the signal of the second control signal terminal; the fifth sub-circuit is configured to provide the signal of the second reference signal terminal to the fourth node in response to the signal of the second control signal terminal; and the sixth sub-circuit is configured to provide the signal of the second reference signal terminal to the third node and the signal output terminal respectively in response to a signal of the fifth node.

Optionally, in the embodiment of the present disclosure, the fourth sub-circuit includes a fifth transistor; wherein the fifth transistor has a gate coupled to the second control signal terminal, a first electrode coupled to the second node, and a second electrode coupled to the fifth node.

Optionally, in the embodiment of the present disclosure, the fifth sub-circuit includes a sixth transistor; wherein the sixth transistor has a gate coupled to the second control signal terminal, a first electrode coupled to the second reference signal terminal, and a second electrode coupled to the fourth node.

Optionally, in the embodiment of the present disclosure, the sixth sub-circuit includes a seventh transistor and an eighth transistor; wherein the seventh transistor has a gate coupled to the fifth node, a first electrode coupled to the second reference signal terminal, and a second electrode coupled to the first third node; and the eighth transistor has a gate coupled to the fifth node, a first electrode coupled to the second reference signal terminal, and a second electrode coupled to the signal output terminal.

Optionally, in the embodiment of the present disclosure, the output circuit includes a ninth transistor, a tenth transistor and a first capacitor; wherein the ninth transistor has a gate coupled to the first reference signal terminal, a first electrode coupled to the first node, and a second electrode coupled to a gate of tenth transistor; the tenth transistor has a first electrode coupled to the second clock signal terminal, and a second electrode coupled to the signal output terminal; and the first capacitor is coupled between the gate of the tenth transistor and the signal output terminal.

Optionally, in the embodiment of the present disclosure, the output circuit includes an eleventh transistor, a twelfth transistor, a thirteenth transistor and a second capacitor; wherein the eleventh transistor has a gate coupled to the first control signal terminal, a first electrode coupled to the first node, and a second electrode coupled to a gate of the thirteenth transistor; the twelfth transistor has a gate coupled to the second control signal terminal, a first electrode coupled to the first node, and a second electrode coupled to the gate of the thirteenth transistor; the thirteenth transistor has a first electrode coupled to the second clock signal terminal, and a second electrode coupled to the signal output terminal; and the second capacitor is coupled between the gate of the thirteenth transistor and the signal output terminal.

Optionally, in the embodiment of the present disclosure, the node control circuit includes a fourteenth transistor and a fifteenth transistor; wherein the fourteenth transistor having a gate coupled to the first node, a first electrode coupled to the first clock signal terminal, and a second electrode coupled to the second node; and the fifteenth transistor has a gate coupled to the second clock signal terminal, a first electrode coupled to the third node, and a second electrode coupled to the first node.

Optionally, in the embodiment of the present disclosure, the input circuit includes a sixteenth transistor and a seventeenth transistor; wherein the sixteenth transistor has a gate coupled to the first clock signal terminal, a first electrode coupled to the input signal terminal, and a second electrode coupled to the first node; and the seventeenth transistor has a gate coupled to the first clock signal terminal, a first electrode coupled to the first reference signal terminal, and a second electrode coupled to the second node.

Optionally, in the embodiment provided in the present disclosure, the shift register unit further includes a third capacitor, wherein the third capacitor is coupled between the second node and the second reference signal terminal.

An embodiment of the present disclosure further provides a gate drive circuit, including a plurality of cascaded shift register units described above, an input signal terminal of a first-stage shift register unit is coupled to a frame trigger signal terminal; and in every two adjacent shift register units, an input signal terminal of a shift register unit of a next stage is coupled to a signal output terminal of a shift register unit of a previous stage.

An embodiment of the present disclosure further provides a display device, including the above gate drive circuit.

An embodiment of the present disclosure further provides a driving method of the above shift register unit. The method includes a first driving cycle and/or a second driving cycle, wherein in the first driving cycle, the method includes: in a first input phase, loading a first level signal to the input signal terminal, loading the first level signal to the first clock signal terminal, loading a second level signal to the second clock signal terminal, loading the first level signal to the first control signal terminal, and loading the second level signal to the second control signal terminal; in a first output phase, loading the second level signal to the input signal terminal, loading the second level signal to the first clock signal terminal, loading the first level signal to the second clock signal terminal, loading the first level signal to the first control signal terminal, and loading the second level signal to the second control signal terminal; and in a first reset phase, loading the second level signal to the input signal terminal, loading the first level signal to the first clock signal terminal, loading the second level signal to the second clock signal terminal, loading the first level signal to the first control signal terminal, and loading the second level signal to the second control signal terminal; and in the second driving cycle, the method includes: in a second input phase, loading the first level signal to the input signal terminal, loading the first level signal to the first clock signal terminal, loading the second level signal to the second clock signal terminal, loading the second level signal to the first control signal terminal, and loading the first level signal to the second control signal terminal; in a second output phase, loading the second level signal to the input signal terminal, loading the second level signal to the first clock signal terminal, loading the first level signal to the second clock signal terminal, loading the second level signal to the first control signal terminal, and loading the first level signal to the second control signal terminal; and in a second reset phase, loading the second level signal to the input signal terminal, loading the first level signal to the first clock signal terminal, loading the second level signal to the second clock signal terminal, loading the second level signal to the first control signal terminal, and loading the first level signal to the second control signal terminal.

DETAILED DESCRIPTION

Figure 1:
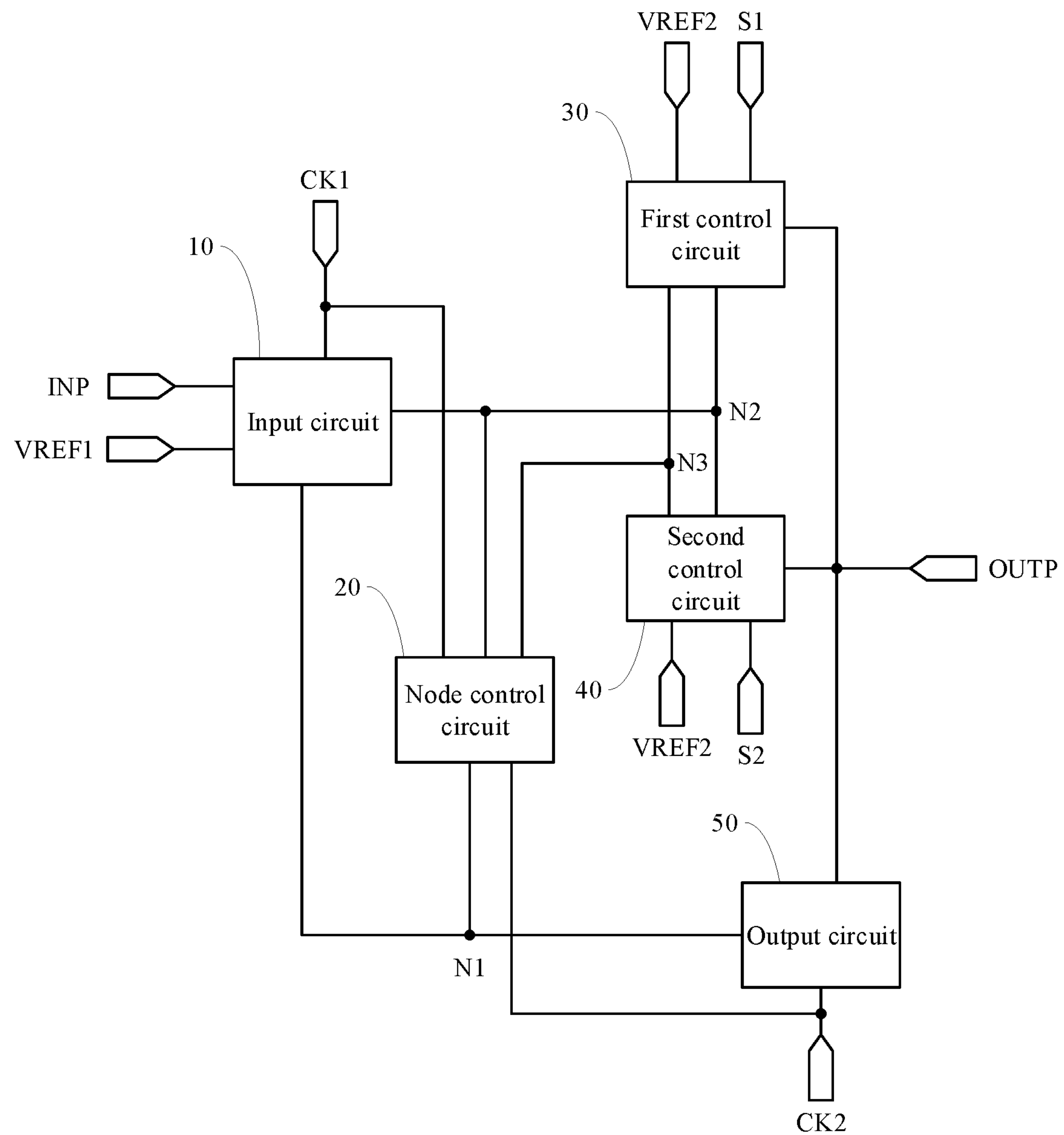
FIG. 1 is a schematic structural diagram of a shift register unit provided in an embodiment of the present disclosure.

To make the objects, technical solutions and advantages of the embodiments of the present disclosure more apparent, the technical solutions in the embodiments of the present disclosure will be described clearly and completely with reference to the drawings in the embodiments of the present disclosure. Obviously, the described embodiments are only a part of the embodiments of the present disclosure, but not all the embodiments. Moreover, the embodiments in the present disclosure and the features in the embodiments can be combined with each other without conflict. Based on the embodiments described herein, all other embodiments obtained by those of ordinary skill in the art without any inventive effort shall fall into the protection scope of the present disclosure.

Unless otherwise defined, technical or scientific terms used in the present disclosure shall have the ordinary meanings understood by those of ordinary skill in the art to which the present disclosure pertains. The terms “first”, “second” and the like used in present disclosure do not indicate any order, quantity or importance, but are only used to distinguish different components. Words such as “include” or “contain” indicate that an element or item appearing before such a word covers listed elements or items appearing after the word and equivalents thereof, and does not exclude other elements or items. Words such as “connect” or “connect with" are not limited to physical or mechanical connections, but may include electrical connections, whether direct or indirect.

It should be noted that sizes and shapes in the drawings do not reflect the true scale, and are merely intended to schematically illustrate the present disclosure. Furthermore, same or similar reference numerals throughout represent same or similar elements or elements having same or similar functions.

Generally, a gate drive circuit usually includes a plurality of cascaded shift register units. The shift register unit usually includes a plurality of transistors, to generate a gate drive signal through the transistors based on an input signal, and the gate drive signal is transmitted to the thin film transistors in sub-pixels on an array substrate to control the turn-on and turn-off of the thin film transistors. However, gates of some thin film transistors in the shift register unit may be under a certain level for a long time, which may cause the thin film transistors to be under a large bias voltage for a long time, resulting in a reduced life of the thin film transistors, thus influencing the service life of the shift register unit and the output stability of the shift register unit.

Based on this, embodiments of the present disclosure provide some shift register units for improving the service life and output stability.

Some embodiments of the present disclosure provide some shift register units. As shown in FIG. 1, the shift register unit may include:

- an input circuit 10 configured to provide a signal of an input signal terminal INP to a first node N1 in response to a signal of a first clock signal terminal CK1; and provide a signal of a first reference signal terminal VREF1 to a second node N2 in response to the signal of the first clock signal terminal CK1;
- a node control circuit 20 configured to provide the signal of the first clock signal terminal CK1 to the second node N2 in response to a signal of the first node N1, and connect the first node N1 with third node N3 in response to a signal of a second clock signal terminal CK2;
- a first control output circuit 30 configured to control a signal of the third node N3 according to signals of a first control signal terminal S1 and the second node N2, and provide a signal of a second reference signal terminal VREF2 to a signal output terminal OUTP;
- a second control output circuit 40 configured to control the signal of the third node N3 according to signals of a second control signal terminal S2 and the second node N2, and provide the signal of the second reference signal terminal VREF2 to the signal output terminal OUTP; and
- an output circuit 50 configured to provide the signal of the second clock signal terminal CK2 to the signal output terminal OUTP according to the signal of the first node N1.

The shift register unit provided in the embodiment of the present disclosure may include an input circuit, a node control circuit, a first control output circuit, a second control output circuit and an output circuit. By providing the first control output circuit and the second control output circuit, the first control output circuit and the second control output circuit may operate alternately, so that the first control output circuit and the second control output circuit may have time for characteristics recovery respectively, thus improving the service life and output stability of the shift register unit.

Figure 2:
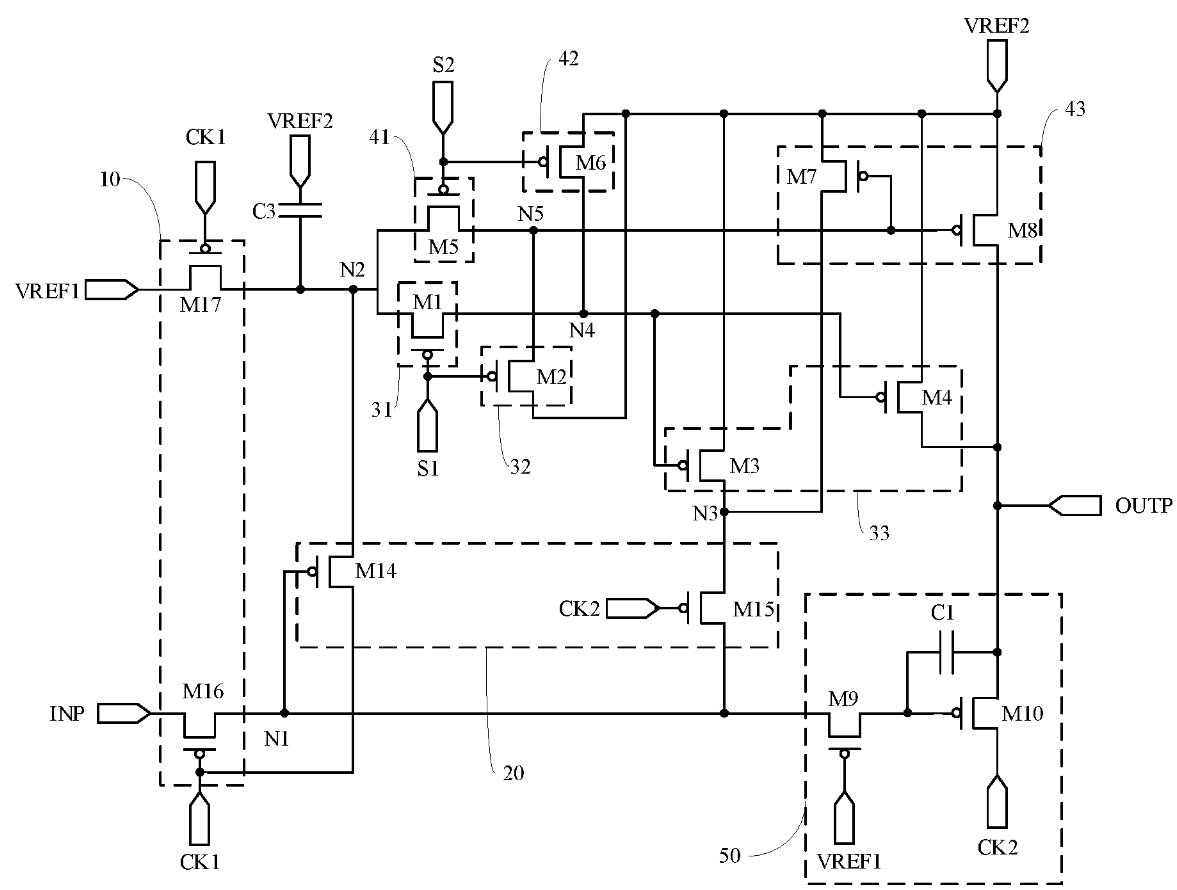
FIG. 2 is a schematic diagram of a specific structure of some shift register units provided in an embodiment of the present disclosure.

In specific implementation, in the embodiment of the present disclosure, as shown in FIG. 2, the first control output circuit 30 may include a first sub-circuit 31, a second sub-circuit 32 and a third sub-circuit 33.

The first sub-circuit 31 is configured to connect the second node N2 with a fourth node N4 in response to the signal of the first control signal terminal S1.

The second sub-circuit 32 is configured to provide the signal of the second reference signal terminal VREF2 to a fifth node N5 in response to the signal of the first control signal terminal S1.

The third sub-circuit 33 is configured to provide the signal of the second reference signal terminal VREF2 to the third node N3 and the signal output terminal OUTP respectively in response to a signal of the fourth node N4.

In specific implementation, in the embodiment of the present disclosure, as shown in FIG. 2, the second control output circuit 40 may include a fourth sub-circuit 41, a fifth sub-circuit 42 and a sixth sub-circuit 43.

The fourth sub-circuit 41 is configured to connect the second node N2 with the fifth node N5 in response to the signal of the second control signal terminal S2.

The fifth sub-circuit 42 is configured to provide the signal of the second reference signal terminal VREF2 to the fourth node N4 in response to the signal of the second control signal terminal S2.

The sixth sub-circuit 43 is configured to provide the signal of the second reference signal terminal VREF2 to the third node N3 and the signal output terminal OUTP respectively in response to a signal of the fifth node N5.

In specific implementation, in the embodiment of the present disclosure, as shown in FIG. 2, the first sub-circuit 31 may include a first transistor M1, wherein the first transistor M1 has a gate coupled to the first control signal terminal S1, a first electrode coupled to the second node N2, and a second electrode coupled to the fourth node N4.

In specific implementation, in the embodiment of the present disclosure, as shown in FIG. 2, the second sub-circuit 32 may include a second transistor M2, wherein the second transistor M2 has a gate coupled to the first control signal terminal S1, a first electrode coupled to the second reference signal terminal VREF2, and a second electrode coupled to the fifth node N5.

In specific implementation, in the embodiment of the present disclosure, as shown in FIG. 2, the third sub-circuit 33 may include a third transistor M3 and a fourth transistor M4, wherein the third transistor M3 has a gate coupled to the fourth node N4, a first electrode coupled to the second reference signal terminal VREF2, and a second electrode coupled to the third node N3; and the fourth transistor M4 has a gate coupled to the fourth node N4, a first electrode coupled to the second reference signal terminal VREF2, and a second electrode coupled to the signal output terminal OUTP.

In specific implementation, in the embodiment of the present disclosure, as shown in FIG. 2, the fourth sub-circuit 41 may include a fifth transistor M5, wherein the fifth transistor M5 has a gate coupled to the second control signal terminal S2, a first electrode coupled to the second node N2, and a second electrode coupled to the fifth node N5.

In specific implementation, in the embodiment of the present disclosure, as shown in FIG. 2, the fifth sub-circuit 42 may include a sixth transistor M6, wherein the sixth transistor M6 has a gate coupled to the second control signal terminal S2, a first electrode coupled to the second reference signal terminal VREF2, and a second electrode coupled to the fourth node N4.

In specific implementation, in the embodiment of the present disclosure, as shown in FIG. 2, the sixth sub-circuit 43 may include a seventh transistor M7 and an eighth transistor M8, wherein the seventh transistor M7 has a gate coupled to the fifth node N5, a first electrode coupled to the second reference signal terminal VREF2, and a second electrode coupled to the third node N3; and the eighth transistor M8 has a gate coupled to the fifth node N5, a first electrode coupled to the second reference signal terminal VREF2, and a second electrode coupled to the signal output terminal OUTP.

In specific implementation, in the embodiment of the present disclosure, as shown in FIG. 2, the input circuit 10 may include a sixteenth transistor M16 and a seventeenth transistor M17, wherein the sixteenth transistor M16 has a gate coupled to the first clock signal terminal CK1, a first electrode coupled to the input signal terminal INP, and a second electrode coupled to the first node N1; and the seventeenth transistor M17 has a gate coupled to the first clock signal terminal CK1, a first electrode coupled to the first reference signal terminal VREF1, and a second electrode coupled to the second node N2.

In specific implementation, in the embodiment of the present disclosure, as shown in FIG. 2, the shift register unit may further include a third capacitor C3, wherein the third capacitor C3 is coupled between the second node N2 and the second reference signal terminal Between VREF2.

In specific implementation, in the embodiment of the present disclosure, as shown in FIG. 2, the node control circuit 20 may include a fourteenth transistor M14 and a fifteenth transistor M15, wherein the fourteenth transistor M14 has a gate coupled to the first node N1, a first electrode coupled to the first clock signal terminal CK1, and a second electrode coupled to the second node N2; and the fifteenth transistor M15 has a gate coupled to the second clock signal terminal CK2, a first electrode coupled to the third node N3, and a second electrode coupled to the first node N1.

In specific implementation, in the embodiment of the present disclosure, as shown in FIG. 2, the output circuit 50 may include a ninth transistor M9, a tenth transistor M10 and a first capacitor C1, wherein the ninth transistor M9 has a gate coupled to the first reference signal terminal VREF1, a first electrode coupled to the first node N1, and a second electrode coupled to a gate of the tenth transistor M10; the tenth transistor M10 has a first electrode coupled to the second clock signal terminal CK2, and a second electrode coupled to the signal output terminal OUTP; and the first capacitor C1 is coupled between the gate of the tenth transistor M10 and the signal output terminal OUTP.

In specific implementation, according to a signal flow direction, the first electrode of the transistor described above may be used as its source, and the second electrode thereof may be used as its drain; or the first electrode is used as its drain, and the second electrode is used as its source. No specific distinction is made here.

It should be noted that the transistors in the above embodiment of the present disclosure may be thin film transistors (TFTs) or metal oxide semiconductor (MOS) field effect transistors, which are not limited here.

To simplify the preparation process, in specific implementation, in the embodiment of the present disclosure, as shown in FIG. 2, all transistors may be P-type transistors. Of course, the embodiment of the present disclosure is described merely by using an example in which the transistors are P-type transistors. In the case where the transistors are N-type transistors, the design principle is same as in the present disclosure, and it also falls within the protection scope of the present disclosure.

Further, in specific implementation, the P-type transistor is turned off under a high-level signal and is turned on under a low-level signal. The N-type transistor is turned on under a high-level signal and turned off under a low-level signal.

In specific implementation, in the embodiment of the present disclosure, when the active pulse signal of the input signal terminal is a low-level signal, the signal of the first reference signal terminal is a low-level signal, and the signal of the second reference signal terminal is a high-level signal. Alternatively, when the active pulse signal of the input signal terminal is a high-level signal, the signal of the first reference signal terminal is a high-level signal, and the signal of the second reference signal terminal is a low-level signal. Of course, in practical applications, specific voltage values of the signals of the above signals may be designed and determined according to the actual application environment, and are not limited herein.

In specific implementation, in the embodiment of the present disclosure, the signal of the first control signal terminal includes alternating high-level and low-level signals. The signal of the second control signal terminal also includes alternating high-level and low-level signals. Moreover, at the same moment, the level of the signal of the first control signal terminal is opposite to the level of the signal of the second control signal terminal. Exemplarily, the signal of the first control signal terminal and the signal of the second control signal terminal are respectively clock signals.

Exemplarily, in specific implementation, the signal of the first control signal terminal may include at least one high-level signal and at least one low-level signal within one frame of scan time. For example, within the first ½ frame of the one frame of scan time, the signal of the first control signal terminal is a high-level signal. Within the last ½ frame of the one frame of scan time, the signal of the first control signal terminal is a low-level signal. Alternatively, within the first ¼ frame of the one frame of scan time, the signal of the first control signal terminal is a high-level signal. Within the second ¼ frame of the one frame of scan time, the signal of the first control signal terminal is a low-level signal. Within the third ¼ frame of the one frame of scan time, the signal at the first control signal terminal is a high-level signal. Within the fourth ¼ frame of the one frame of scan time, the signal of the first control signal terminal is a low-level signal.

Exemplarily, in specific implementation, the signal of the first control signal terminal may include at least one high-level signal and at least one low-level signal within at least two adjacent frames of scan time. The high-level signal and the low-level signal of the first control signal terminal may be switched within blanking time. For example, within the first frame of the two adjacent frames of scan time, the signal of the first control signal terminal is a low-level signal. Within the second frame of the two adjacent frames of scan time, the signal of the first control signal terminal is a high-level signal. Alternatively, within the first five frames of ten adjacent frames of scan time, the signal of the first control signal terminal is a low-level signal. Within the last five frames of the ten adjacent frames of scan time, the signal of the first control signal terminal is a high-level signal.

Described above is only an example of the specific structure of the shift register unit provided in the embodiment of the present disclosure. In specific implementation, the specific structures of the above circuits are not limited to the foregoing structures provided in the embodiment of the present disclosure, but may also be other structures known to those skilled in the art, which are not limited here.

The working process of the above shift register unit provided in the embodiment of the present disclosure is described below by using the shift register unit shown in FIG. 2 as an example, in conjunction with a signal timing diagram shown in FIG. 3. In the following description, the numeral 1 represents a high-level signal, and 0 represents a low-level signal. It should be noted that 1 and 0 are logic levels, only for better explaining the specific working process of the embodiments of the present disclosure, and are not voltages applied to the gates of the transistors in specific implementation.

For example, the first reference signal terminal VREF1 is a low-level signal, and the second reference signal terminal VREF2 is a high-level signal; and within the first frame of two adjacent frames of scan time, the signal of the first control signal terminal S1 is a low-level signal, and within the second frame of two adjacent frames of scan time, the signal of the first control signal terminal S1 is a high-level signal. The first driving cycle T10 and a second driving cycle T20 are selected from the signal timing diagram shown in FIG. 3. The first frame of two adjacent frames of scan time may be used as a first driving cycle T10, and the second frame of two adjacent frames of scan time may be used as a second driving cycle T20.

The first driving cycle T10 includes: a first input phase t11, a first output phase t12, and a first reset phase t13. The second driving cycle T20 includes: a second input phase t21, a second output phase t22, and a second reset phase t23.

In the first driving cycle T10, since the signal of the second control signal terminal S2 is a high-level signal, the fifth transistor M5 and the sixth transistor M6 are turned off all the time. Since the signal of the first control signal terminal S1 is a low-level signal, the first transistor M1 and the second transistor M2 are turned on all the time. The turned-on first transistor M1 connects the second node N2 with the fourth node N4. The turned-on second transistor M2 provides the high-level signal of the second reference signal terminal VREF2 to the fifth node N5, so that the signal of the fifth node N5 is a high-level signal to control the seventh transistor M7 and the eighth transistor M8 to be turned off.

In the first input phase t11, INP=0, CK1=0, and CK2=1.

Since CK2=1, the fifteenth transistor M15 is turned off. Since CK1=0, both the sixteenth transistor M16 and the seventeenth transistor M17 are turned on. The turned-on seventeenth transistor M17 provides the low-level signal of the first reference signal terminal VREF1 to the second node N2, so that the signal of the second node N2 is a low-level signal, and the signal of the fourth node N4 is low-level signal, to control the fourth transistor M4 to be turned on to provide the high-level signal of the second reference signal terminal VREF2 to the signal output terminal OUTP, so that the signal output terminal OUTP outputs a high-level signal. The turned-on sixteenth transistor M16 provides the low-level signal of the input signal terminal INP to the first node N1, so that the signal of the first node N1 is a low-level signal, to control the fourteenth transistor M14 to be turned on. The turned-on fourteenth transistor M14 provides the low-level signal of the first clock signal terminal CK1 to the second node N2, so that the signal of the second node N2 is a low-level signal. Since the ninth transistor M9 is turned on under the control of the first reference signal terminal VREF1 to provide the low-level signal of the first node to the tenth transistor M10, the tenth transistor M10 may be controlled to be turned on. The turned-on tenth transistor M10 provides the high-level signal of the second clock signal terminal CK2 to the signal output terminal OUTP, so that the first capacitor C1 is charged and the signal output terminal OUTP outputs a high-level signal.

In the first output phase t12, INP=1, CK1=1, and CK2=0.

Since CK1=1, the sixteenth transistor M16 and the seventeenth transistor M17 are both turned off, and the first node N1 is in a floating state. Due to the first capacitor C1, the signal of the first node N1 may be kept as the low-level signal, so that the tenth transistor M10 may be controlled to be turned on. The turned-on tenth transistor M10 provides the low-level signal of the second clock signal terminal CK2 to the signal output terminal OUTP, so that the signal output terminal OUTP outputs a low-level signal. Due to the bootstrap coupling effect of the first capacitor C1, the level of the first node N1 may be further pulled down, so that the fourteenth transistor M14 and the tenth transistor M10 may be fully turned on as much as possible. The turned-on fourteenth transistor M14 provides the high-level signal of the first clock signal terminal CK1 to the second node N2, so that the signal of the second node N2 is a high-level signal, to control the third transistor M3 and the fourth transistor M4 to be turned off. The turned-on tenth transistor M10 provides the low-level signal of the second clock signal terminal CK2 to the signal output terminal OUTP with as little voltage loss as possible, so that the signal output terminal OUTP outputs a low-level signal.

In the first reset phase t13, INP=1, CK1=0, and CK2=1.

Since CK2=1, the fifteenth transistor M15 is turned off. Since CK1=0, both the sixteenth transistor M16 and the seventeenth transistor M17 are turned on. The turned-on sixteenth transistor M16 provides the high-level signal of the input signal terminal INP to the first node N1, so that the signal of the first node N1 is a high-level signal, to control the fourteenth transistor M14 and the tenth transistor M10 to be turned off. The turned-on seventeenth transistor M17 provides the low-level signal of the first reference signal terminal VREF1 to the second node N2, so that the signal of the second node N2 is a low-level signal, and the third capacitor C3 is charged. Hence, the signal of the fourth node N4 is a low-level signal, to control the fourth transistor M4 to be turned on to provide the high-level signal of the second reference signal terminal VREF2 to the signal output terminal OUTP, so that the signal output terminal OUTP outputs a high-level signal.

After the first reset phase t13, a first holding phase t14 may also be included. In the first holding phase t14, INP=1, CK1=1, and CK2=0.

Since CK1=1, both the sixteenth transistor M16 and the seventeenth transistor M17 are turned off, and the second node N2 is in a floating state. Due to the third capacitor C3, the signal of the second node N2 may be kept as a low-level signal. Hence, the signal of the fourth node N4 is a low-level signal, to control both the third transistor M3 and the fourth transistor M4 to be turned on. Since CK2=0, the fifteenth transistor M15 is turned on. The turned-on third transistor M3 and fifteenth transistor M15 provide the high-level signal of the second reference signal terminal VREF2 to the first node N1, so that the signal of the first node N1 is a high-level signal, to control both the fourteenth transistor M14 and the tenth transistor M10 to be turned off. The turned-on fourth transistor M4 provides the high-level signal of the second reference signal terminal VREF2 to the signal output terminal OUTP, so that the signal output terminal OUTP outputs a high-level signal.

Then, in the first driving cycle T10, the processes of the first reset phase t13 and the first holding phase t14 are repeated, and will not be repeated here.

Then, the second driving cycle T20 comes. In the second driving cycle T20, since the signal of the first control signal terminal S1 is a high-level signal, the first transistor M1 and the second transistor M2 are turned off all the time. Since the signal of the second control signal terminal S2 is a low-level signal, the fifth transistor M5 and the sixth transistor M6 are turned on all the time. The turned-on fifth transistor M5 connect the second node N2 with the fifth node N5. The turned-on sixth transistor M6 provides the high-level signal of the second reference signal terminal VREF2 to the fourth node N4, so that the signal of the fourth node N4 is a high-level signal all the time to control both the third transistor M3 and the fourth transistor M4 to be turned off.

In the second input phase t21, INP=0, CK1=0, and CK2=1.

Since CK2=1, the fifteenth transistor M15 is turned off. Since CK1=0, both the sixteenth transistor M16 and the seventeenth transistor M17 are turned on. The turned-on seventeenth transistor M17 provides the low-level signal of the first reference signal terminal VREF1 to the second node N2, so that the signal of the second node N2 is a low-level signal, and the signal of the fifth node N5 is low-level signal, thereby controlling the eighth transistor M8 to be turned on to provide the high-level signal of the second reference signal terminal VREF2 to the signal output terminal OUTP, so that the signal output terminal OUTP outputs a high-level signal. The turned-on sixteenth transistor M16 provides the low-level signal of the input signal terminal INP to the first node N1, so that the signal of the first node N1 is a low-level signal, thereby controlling the fourteenth transistor M14 to be turned on. The turned-on fourteenth transistor M14 provides the low-level signal of the first clock signal terminal CK1 to the second node N2, so that the signal of the second node N2 is a low-level signal. Since the ninth transistor M9 is turned on under the control of the first reference signal terminal VREF1 to provide the low-level signal of the first node to the tenth transistor M10, the tenth transistor M10 may be controlled to be turned on. The turned-on tenth transistor M10 provides the high-level signal of the second clock signal terminal CK2 to the signal output terminal OUTP, so that the first capacitor C1 is charged and the signal output terminal OUTP outputs a high-level signal.

In the second output phase t22, INP=1, CK1=1, and CK2=0.

Since CK1=1, the sixteenth transistor M16 and the seventeenth transistor M17 are both turned off, and the first node N1 is in a floating state. Due to the first capacitor C1, the signal of the first node N1 may be kept as a low-level signal, so that the tenth transistor M10 may be controlled to be turned on. The turned-on tenth transistor M10 provides the low-level signal of the second clock signal terminal CK2 to the signal output terminal OUTP, so that the signal output terminal OUTP outputs a low-level signal. Due to the bootstrap coupling effect of the first capacitor C1, the level of the first node N1 may be further pulled down, so that the fourteenth transistor M14 and the tenth transistor M10 may be fully turned on as much as possible. The turned-on fourteenth transistor M14 provides the high-level signal of the first clock signal terminal CK1 to the second node N2, so that the signal of the second node N2 is a high-level signal, thereby controlling both the seventh transistor M7 and the eighth transistor M8 to be turned off. The turned-on tenth transistor M10 provides the low-level signal of the second clock signal terminal CK2 to the signal output terminal OUTP with as little voltage loss as possible, so that the signal output terminal OUTP outputs a low-level signal.

In the second reset phase t23, INP=1, CK1=0, and CK2=1.

Since CK2=1, the fifteenth transistor M15 is turned off. Since CK1=0, both the sixteenth transistor M16 and the seventeenth transistor M17 are turned on. The turned-on sixteenth transistor M16 provides the high-level signal of the input signal terminal INP to the first node N1, so that the signal of the first node N1 is a high-level signal, thereby controlling the fourteenth transistor M14 and the tenth transistor M10 to be turned off. The turned-on seventeenth transistor M17 provides the low-level signal of the first reference signal terminal VREF1 to the second node N2, so that the signal of the second node N2 is a low-level signal, and the third capacitor C3 is charged. Hence, the signal of the fourth node N4 is a low-level signal, thereby controlling the eighth transistor M8 to be turned on to provide the high-level signal of the second reference signal terminal VREF2 to the signal output terminal OUTP, so that the signal output terminal OUTP outputs a high-level signal.

After the second reset phase t23, a second holding phase t24 may also be included. In the second holding phase t24, INP=1, CK1=1, and CK2=0.

Since CK1=1, both the sixteenth transistor M16 and the seventeenth transistor M17 are turned off, and the second node N2 is in a floating state. Due to the third capacitor C3, the signal of the second node N2 may be kept as a low-level signal. Hence, the signal of the fourth node N4 is a low-level signal, thereby controlling both the seventh transistor M7 and the eighth transistor M8 to be turned on. Since CK2=0, the fifteenth transistor M15 is turned on. The turned-on seventh transistor M7 and fifteenth transistor M15 provide the high-level signal of the second reference signal terminal VREF2 to the first node N1, so that the signal of the first node N1 is a high-level signal, thereby controlling both the fourteenth transistor M14 and the tenth transistor M10 to be turned off. The turned-on eighth transistor M8 provides the high-level signal of the second reference signal terminal VREF2 to the signal output terminal OUTP, so that the signal output terminal OUTP outputs a high-level signal.

Then, in the second driving cycle T20, the processes of the second reset phase t23 and the second holding phase t24 are repeated, and will not be repeated here.

According to the above working process, in the first driving cycle T10, the first to fourth transistors M1-M4, the ninth transistor M9, the tenth transistor M10, the fourteenth to seventeenth transistor M14-M17, the first capacitor C1 and the third capacitor C3 cooperate so that the signal output terminal OUTP may output a signal. In the second driving cycle T10, the fifth to tenth transistors M5-M10, the fourteenth to seventeenth transistors M14-M17, the first capacitor C1 and the third capacitor C3 cooperate so that the signal output terminal OUTP may output a signal.

Generally, after the reset phase, the transistor which outputs a high-level signal to the signal output terminal OUTP works at the same voltage for a long time, which reduces the life of the transistor, and thus influences the service life and output stability of the shift register unit. In the embodiment of the present disclosure, as the first to fourth transistors M1-M4 and the fifth to eighth transistors M5-M8 operate alternately, the first to fourth transistors M1-M4 and the fifth to eighth transistors M5-M8 may have time for characteristic recovery, especially the fourth transistor M4 and the eighth transistor M8 may have time for characteristic recovery respectively, so that the service life of the fourth transistor M4 and the eighth transistor M8 may be increased, and thus the service life and output stability of the shift register unit are improved.

Figure 3:
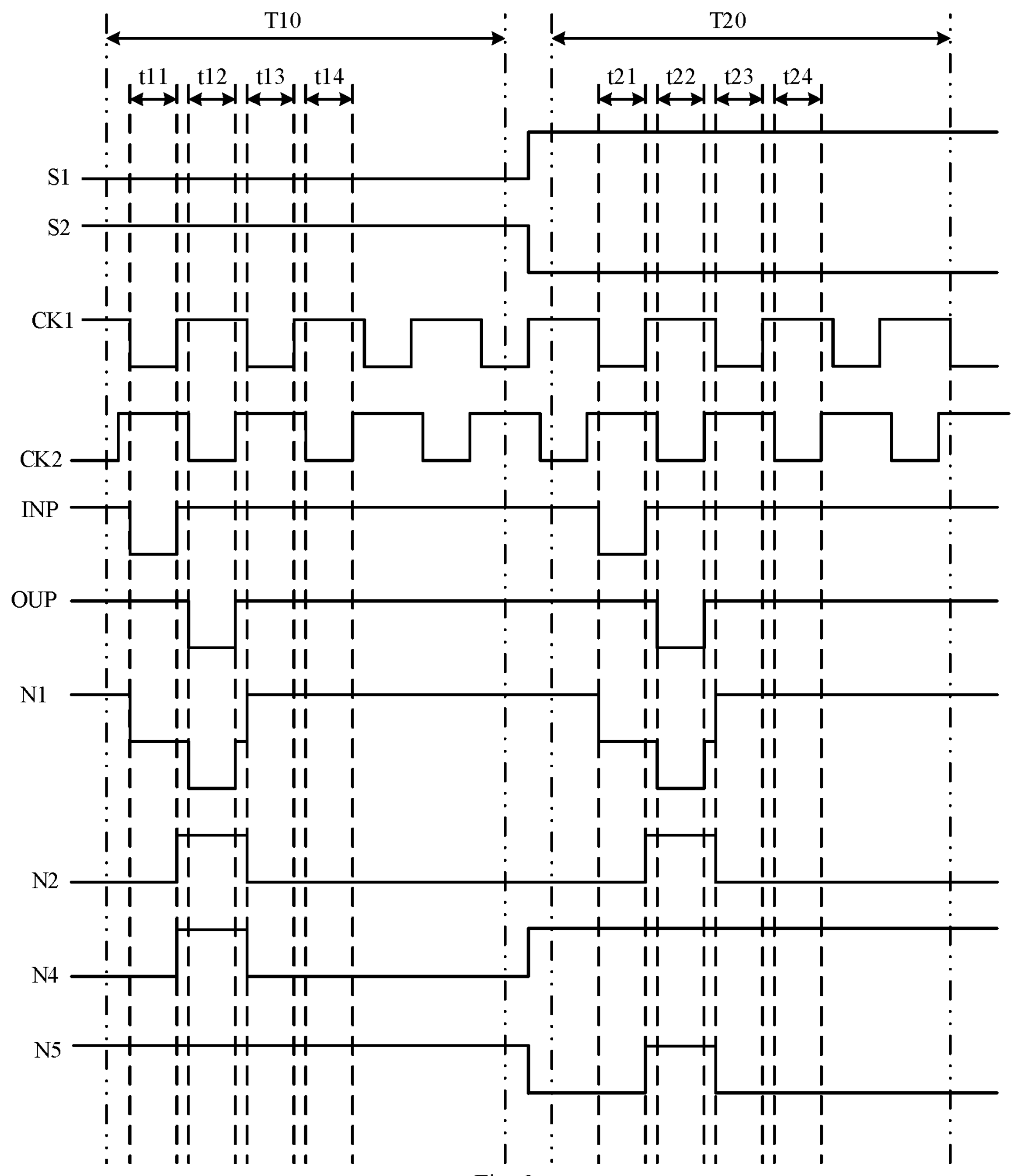
FIG. 3 is a circuit timing diagram provided in an embodiment of the present disclosure.

It should be noted that the signal timing diagram shown in FIG. 3 is only directed to working processes of a shift register unit in a first driving cycle T10 and a second driving cycle T20. Working processes of other shift register units in the first driving cycle T10 and the second driving cycle T20 are substantially same, and will not be repeated here. In addition, working processes of the shift register unit in other first driving cycles T10 and second driving cycles T20 are substantially same as the working processes in this embodiment, and will not be repeated here.

It should be noted that the above description is based on an example in which the signal of the first control signal terminal S1 is a low-level signal within the first frame of two adjacent frames of scan time, and the signal of the first control signal terminal S1 is a high-level signal within the second frame of two adjacent frames of scan time. However, within some frames of a plurality of adjacent frames of scan time, when the signal of the first control signal terminal S1 is a low-level signal, the shift register unit adopts the working process of the first driving cycle to perform signal output in each of the afore-mentioned frames. In other frames of the plurality of adjacent frames of scan time, when the signal of the first control signal terminal S1 is a high-level signal, the shift register unit adopts the working process of the second driving cycle to perform signal output in each of the other frames. For example, within the first five frames of ten adjacent frames of scan time, the signal of the first control signal terminal S1 is a low-level signal, and the shift register unit adopts the working process of the first driving cycle to perform signal output in each of the first five frames. Within the last five frames of the ten adjacent frames of scan time, the signal of the first control signal terminal S1 is a high-level signal, and the shift register unit adopts the working process of the second driving cycle to perform signal output in each of the last five frames.

Figure 4:
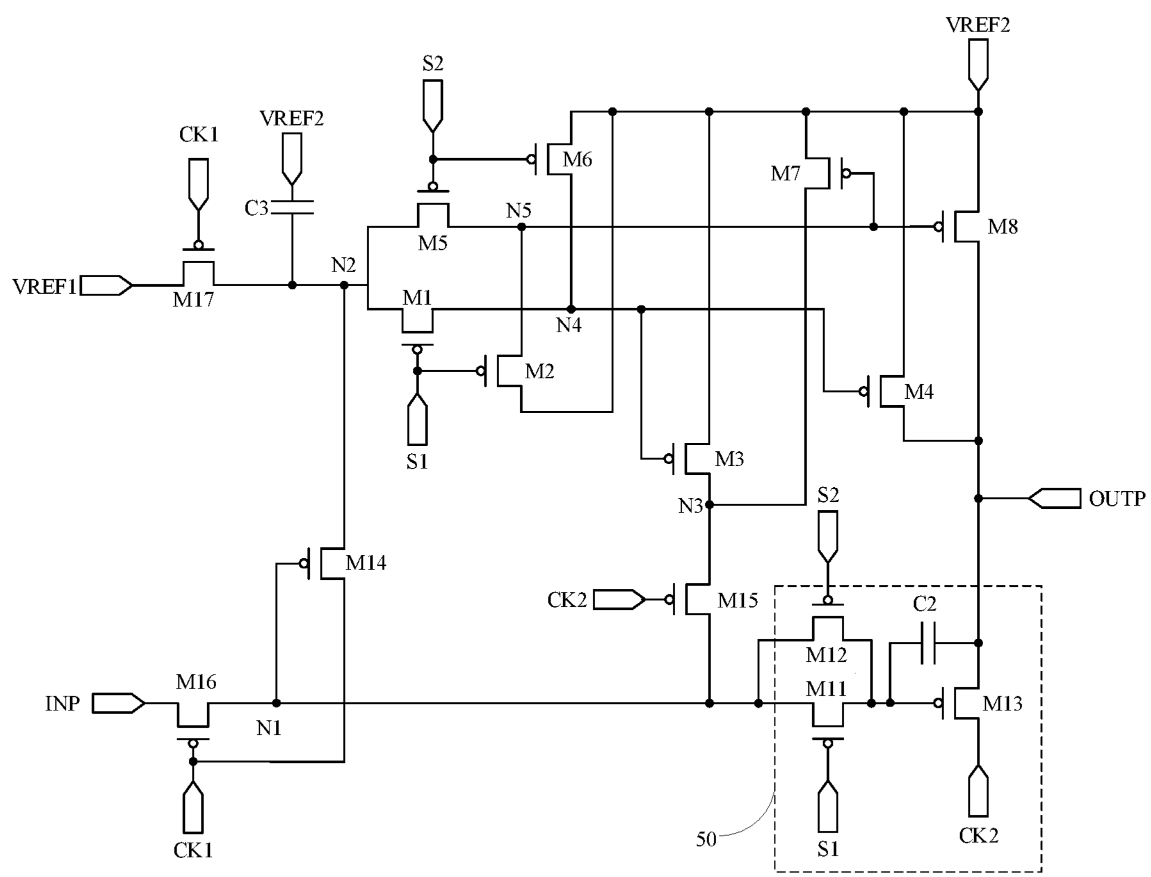
FIG. 4 is a schematic diagram of a specific structure of some other shift register units provided in an embodiment of the present disclosure.

Some other shift register units provided in an embodiment of the present disclosure are shown in FIG. 4. Some implementations in the foregoing embodiment are modified in this embodiment. Only differences between this embodiment and the foregoing embodiment are described below, while similarities are not repeated here.

In specific implementation, in the embodiment of the present disclosure, as shown in FIG. 4, the output circuit 50 may also include an eleventh transistor M11, a twelfth transistor M12, a thirteenth transistor M13, and a second capacitor C2.

The eleventh transistor M11 has a gate coupled to the first control signal terminal S1, a first electrode coupled to the first node N1, and a second electrode coupled to a gate of the thirteenth transistor M13.

The twelfth transistor M12 has a gate coupled to the second control signal terminal S2, a first electrode coupled to the first node N1, and a second electrode coupled to the gate of the thirteenth transistor M13.

The thirteenth transistor M13 has a first electrode coupled to the second clock signal terminal CK2, and a second electrode coupled to the signal output terminal OUTP.

The second capacitor C2 is coupled between the gate of the thirteenth transistor M13 and the signal output terminal OUTP.

In specific implementation, according to a signal flow direction, a first electrode of a transistor described above may be used as its source, and a second electrode thereof may be used as its drain; or the first electrode is used as its drain, and the second electrode is used as its source. No specific distinction is made here.

It should be noted that the transistors in the above embodiment of the present disclosure may be thin film transistors (TFTs) or metal oxide semiconductor (MOS) field effect transistors, which are not limited here.

To simplify the preparation process, in specific implementation, in the embodiment of the present disclosure, as shown in FIG. 4, all transistors may be P-type transistors. Of course, the embodiment of the present disclosure is described merely by using an example in which the transistors are P-type transistors. In the case where the transistors are N-type transistors, the design principle is same as in the present disclosure, and it also falls within the protection scope of the present disclosure.

Further, in specific implementation, the P-type transistor is turned off under a high-level signal and is turned on under a low-level signal. The N-type transistor is turned on under a high-level signal and turned off under a low-level signal.

Described above is only an example of the specific structure of the shift register unit provided in the embodiment of the present disclosure. In specific implementation, the specific structure of the output circuit described above is not limited to the foregoing structure provided in the embodiment of the present disclosure, but may also be other structures known to those skilled in the art, which are not limited here.

The working process of the above shift register unit provided in the embodiment of the present disclosure is described below by using the shift register unit shown in FIG. 4 as an example, in conjunction with a signal timing diagram shown in FIG. 3. In the following description, the numeral 1 represents a high-level signal, and 0 represents a low-level signal. It should be noted that 1 and 0 are logic levels, only for better explaining the specific working process of the embodiments of the present disclosure, and are not voltages applied to the gates of the transistors in specific implementation.

In the first driving cycle T10, since the signal of the second control signal terminal S2 is a high-level signal, the fifth transistor M5, the sixth transistor M6 and the twelfth transistor M12 are turned off all the time. Since the signal of the first control signal terminal S1 is a low-level signal, the first transistor M1, the second transistor M2 and the eleventh transistor M11 are turned on all the time. The turned-on first transistor M1 connects the second node N2 with the fourth node N4. The turned-on eleventh transistor M11 connects the first node N1 with the gate of the thirteenth transistor M13. The turned-on second transistor M2 provides the high-level signal of the second reference signal terminal VREF2 to the fifth node N5, so that the signal of the fifth node N5 is a high-level signal all the time to control both the seventh transistor M7 and the eighth transistor M8 to be turned off.

In the first input phase t11, INP=0, CK1=0, and CK2=1. Since CK2=1, the fifteenth transistor M15 is turned off. Since CK1=0, both the sixteenth transistor M16 and the seventeenth transistor M17 are turned on. The turned-on seventeenth transistor M17 provides the low-level signal of the first reference signal terminal VREF1 to the second node N2, so that the signal of the second node N2 is a low-level signal, and the signal of the fourth node N4 is a low-level signal, thereby controlling the fourth transistor M4 to be turned on to provide the high-level signal of the second reference signal terminal VREF2 to the signal output terminal OUTP, so that the signal output terminal OUTP outputs a high-level signal. The turned-on sixteenth transistor M16 provides the low-level signal of the input signal terminal INP to the first node N1, so that the signal of the first node N1 is a low-level signal, thereby controlling the fourteenth transistor M14 to be turned on. The turned-on fourteenth transistor M14 provides the low-level signal of the first clock signal terminal CK1 to the second node N2, so that the signal of the second node N2 is a low-level signal. The turned-on eleventh transistor M11 provides the low-level signal of the first node to the thirteenth transistor M13, to control the thirteenth transistor M13 to be turned on. The turned-on thirteenth transistor M13 provides the high-level signal of the second clock signal terminal CK2 to the signal output terminal OUTP, so that the second capacitor C2 is charged, and the signal output terminal OUTP outputs a high-level signal.

In the first output phase t12, INP=1, CK1=1, and CK2=0.

Since CK1=1, the sixteenth transistor M16 and the seventeenth transistor M17 are both turned off, and the first node N1 is in a floating state. Due to the second capacitor C2, the signal of the first node N1 may be kept as a low-level signal, so that the thirteenth transistor M13 may be controlled to be turned on. The turned-on thirteenth transistor M13 provides the low-level signal of the second clock signal terminal CK2 to the signal output terminal OUTP, so that the signal output terminal OUTP outputs a low-level signal. Due to the bootstrap coupling effect of the second capacitor C2, the level of the first node N1 may be further pulled down, so that the fourteenth transistor M14 and the thirteenth transistor M13 may be fully turned on as much as possible. The turned-on fourteenth transistor M14 provides the high-level signal of the first clock signal terminal CK1 to the second node N2, so that the signal of the second node N2 is a high-level signal, thereby controlling both the third transistor M3 and the fourth transistor M4 to be turned off. The turned-on thirteenth transistor M13 provides the low-level signal of the second clock signal terminal CK2 to the signal output terminal OUTP with as little voltage loss as possible, so that the signal output terminal OUTP outputs a low-level signal.

In the first reset phase t13, INP=1, CK1=0, and CK2=1.

Since CK2=1, the fifteenth transistor M15 is turned off. Since CK1=0, both the sixteenth transistor M16 and the seventeenth transistor M17 are turned on. The turned-on sixteenth transistor M16 provides the high-level signal of the input signal terminal INP to the first node N1, so that the signal of the first node N1 is a high-level signal, thereby controlling the fourteenth transistor M14 and the thirteenth transistor M13 to be turned off. The turned-on seventeenth transistor M17 provides the low-level signal of the first reference signal terminal VREF1 to the second node N2, so that the signal of the second node N2 is a low-level signal, and the third capacitor C3 is charged. Hence, the signal of the fourth node N4 is a low-level signal, thereby controlling the fourth transistor M4 to be turned on to provide the high-level signal of the second reference signal terminal VREF2 to the signal output terminal OUTP, so that the signal output terminal OUTP outputs a high-level signal.

After the first reset phase t13, a first holding phase t14 may also be included. In the first holding phase t14, INP=1, CK1=1, and CK2=0.

Since CK1=1, both the sixteenth transistor M16 and the seventeenth transistor M17 are turned off, and the second node N2 is in a floating state. Due to the third capacitor C3, the signal of the second node N2 may be kept as a low-level signal. Hence, the signal of the fourth node N4 is a low-level signal, thereby controlling both the third transistor M3 and the fourth transistor M4 to be turned on. Since CK2=0, the fifteenth transistor M15 is turned on. The turned-on third transistor M3 and fifteenth transistor M15 provide the high-level signal of the second reference signal terminal VREF2 to the first node N1, so that the signal of the first node N1 is a high-level signal, thereby controlling both the fourteenth transistor M14 and the thirteenth transistor M13 to be turned off. The turned-on fourth transistor M4 provides the high-level signal of the second reference signal terminal VREF2 to the signal output terminal OUTP, so that the signal output terminal OUTP outputs a high-level signal.

Then, in the first driving cycle T10, the processes of the first reset phase t13 and the first holding phase t14 are repeated, which will not be repeated here.

Then, the second driving cycle T20 comes. In the second driving cycle T20, since the signal of the first control signal terminal S1 is a high-level signal, the first transistor M1, the second transistor M2 and the eleventh transistor M11 are turned off all the time. Since the signal of the second control signal terminal S2 is a low-level signal, the fifth transistor M5, the sixth transistor M6 and the twelfth transistor M12 are turned on all the time. The turned-on fifth transistor M5 connects the second node N2 with the fifth node N5. The turned-on twelfth transistor M12 connects the first node N1 with the thirteenth transistor M13. The turned-on sixth transistor M6 provides the high-level signal of the second reference signal terminal VREF2 to the fourth node N4, so that the signal of the fourth node N4 is a high-level signal all the time to control both the third transistor M3 and the fourth transistor M4 to be turned off.

In the second input phase t21, INP=0, CK1=0, and CK2=1.

Since CK2=1, the fifteenth transistor M15 is turned off. Since CK1=0, both the sixteenth transistor M16 and the seventeenth transistor M17 are turned on. The turned-on seventeenth transistor M17 provides the low-level signal of the first reference signal terminal VREF1 to the second node N2, so that the signal of the second node N2 is a low-level signal, and the signal of the fifth node N5 is a low-level signal, thereby controlling the eighth transistor M8 to be turned on to provide the high-level signal of the second reference signal terminal VREF2 to the signal output terminal OUTP, so that the signal output terminal OUTP outputs a high-level signal. The turned-on sixteenth transistor M16 provides the low-level signal of the input signal terminal INP to the first node N1, so that the signal of the first node N1 is a low-level signal, thereby controlling the fourteenth transistor M14 to be turned on. The turned-on fourteenth transistor M14 provides the low-level signal of the first clock signal terminal CK1 to the second node N2, so that the signal of the second node N2 is a low-level signal. The turned-on twelfth transistor M12 provides the low-level signal of the first node N1 to the thirteenth transistor M13, so that the thirteenth transistor M13 may be controlled to be turned on. The turned-on thirteenth transistor M13 provides the high-level signal of the second clock signal terminal CK2 to the signal output terminal OUTP, so that the second capacitor C2 is charged, and the signal output terminal OUTP outputs a high-level signal.

In the second output phase t22, INP=1, CK1=1, and CK2=0.

Since CK1=1, the sixteenth transistor M16 and the seventeenth transistor M17 are both turned off, and the first node N1 is in a floating state. Due to the second capacitor C2, the signal of the first node N1 may be kept as a low-level signal, so that the thirteenth transistor M13 may be controlled to be turned on. The turned-on thirteenth transistor M13 provides the low-level signal of the second clock signal terminal CK2 to the signal output terminal OUTP, so that the signal output terminal OUTP outputs a low-level signal. Due to the bootstrap coupling effect of the second capacitor C2, the level of the first node N1 may be further pulled down, so that the fourteenth transistor M14 and the thirteenth transistor M13 may be fully turned on as much as possible. The turned-on fourteenth transistor M14 provides the high-level signal of the first clock signal terminal CK1 to the second node N2, so that the signal of the second node N2 is a high-level signal, thereby controlling both the seventh transistor M7 and the eighth transistor M8 to be turned off. The turned-on thirteenth transistor M13 provides the low-level signal of the second clock signal terminal CK2 to the signal output terminal OUTP with as little voltage loss as possible, so that the signal output terminal OUTP outputs a low-level signal.

In the second reset phase t23, INP=1, CK1=0, and CK2=1.

Since CK2=1, the fifteenth transistor M15 is turned off. Since CK1=0, both the sixteenth transistor M16 and the seventeenth transistor M17 are turned on. The turned-on sixteenth transistor M16 provides the high-level signal of the input signal terminal INP to the first node N1, so that the signal of the first node N1 is a high-level signal, thereby controlling the fourteenth transistor M14 and the thirteenth transistor M13 to be turned off. The turned-on seventeenth transistor M17 provides the low-level signal of the first reference signal terminal VREF1 to the second node N2, so that the signal of the second node N2 is a low-level signal, and the third capacitor C3 is charged. Hence, the signal of the fourth node N4 is a low-level signal, thereby controlling the eighth transistor M8 to be turned on to provide the high-level signal of the second reference signal terminal VREF2 to the signal output terminal OUTP, so that the signal output terminal OUTP outputs a high-level signal.

After the second reset phase t23, a second holding phase t24 may also be included. In the second holding phase t24, INP=1, CK1=1, and CK2=0.

Since CK1=1, both the sixteenth transistor M16 and the seventeenth transistor M17 are turned off, and the second node N2 is in a floating state. Due to the third capacitor C3, the signal of the second node N2 may be kept as a low-level signal. Hence, the signal of the fourth node N4 is a low-level signal, thereby controlling both the seventh transistor M7 and the eighth transistor M8 to be turned on. Since CK2=0, the fifteenth transistor M15 is turned on. The turned-on seventh transistor M7 and fifteenth transistor M15 provide the high-level signal of the second reference signal terminal VREF2 to the first node N1, so that the signal of the first node N1 is a high-level signal, thereby controlling both the fourteenth transistor M14 and the thirteenth transistor M13 to be turned off. The turned-on eighth transistor M8 provides the high-level signal of the second reference signal terminal VREF2 to the signal output terminal OUTP, so that the signal output terminal OUTP outputs a high-level signal.

Then, in the second driving cycle T20, the processes of the second reset phase t23 and the second holding phase t24 are repeated, and will not be repeated here.

In the embodiment of the present disclosure, as the eleventh transistor M11 and the twelfth transistor M12 operate alternately, the eleventh transistor M11 and the twelfth transistor M12 may have time for characteristic recovery respectively, so that the service life of the eleventh transistor M11 and the twelfth transistor M12 may be increased, and gate voltage leakage of the thirteenth transistor M13 may be reduced, and the service life and output stability of the shift register unit are further improved.

Based on the same inventive concept, an embodiment of the present disclosure also provides a driving method of the above shift register unit. The working principle and specific implementation of the driving method are same as those of the shift register unit in the above embodiment. Therefore, the driving method may be implemented by referring to the specific implementation of the shift register unit in the above embodiment, which will not be repeated here.

Figure 5:
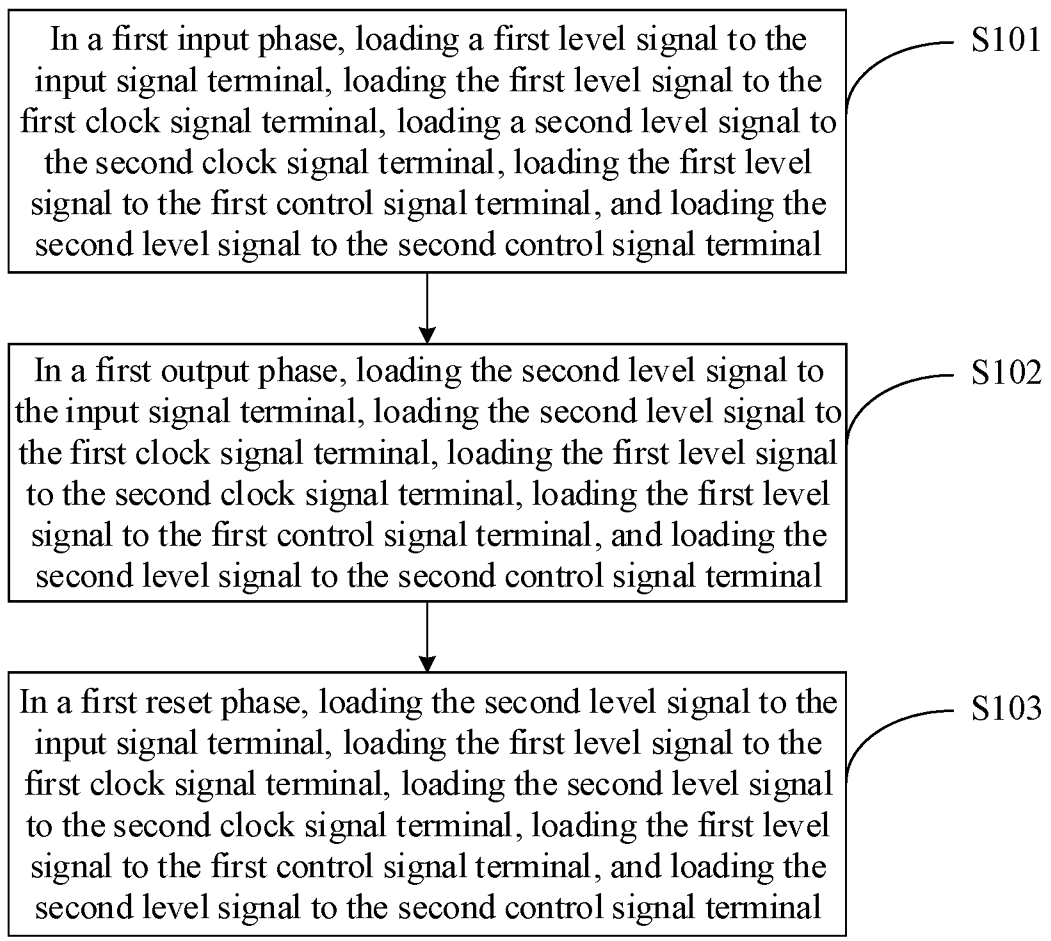
FIG. 5 is a flow diagram of a driving method of some shift register units provided in an embodiment of the present disclosure.

In specific implementation, in the embodiment of the present disclosure, as shown in FIG. 5, the driving method may include a first driving cycle. The first driving cycle may include the following steps.

In S101, in a first input phase, a first level signal is loaded to the input signal terminal, the first level signal is loaded the first clock signal terminal, a second level signal is loaded to the second clock signal terminal, the first level signal is loaded to the first control signal terminal, and the second level signal is loaded to the second control signal terminal.

In S102, in a first output phase, the second level signal is loaded to the input signal terminal, the second level signal is loaded to the first clock signal terminal, the first level signal is loaded to the second clock signal terminal, the first level signal is loaded to the first control signal terminal, and the second level signal is loaded to the second control signal terminal.

In S103, in a first reset phase, the second level signal is loaded to the input signal terminal, the first level signal is loaded to the first clock signal terminal, the second level signal is loaded to the second clock signal terminal, the first level signal is loaded to the first control signal terminal, and the second level signal is loaded to the second control signal terminal.

Figure 6:
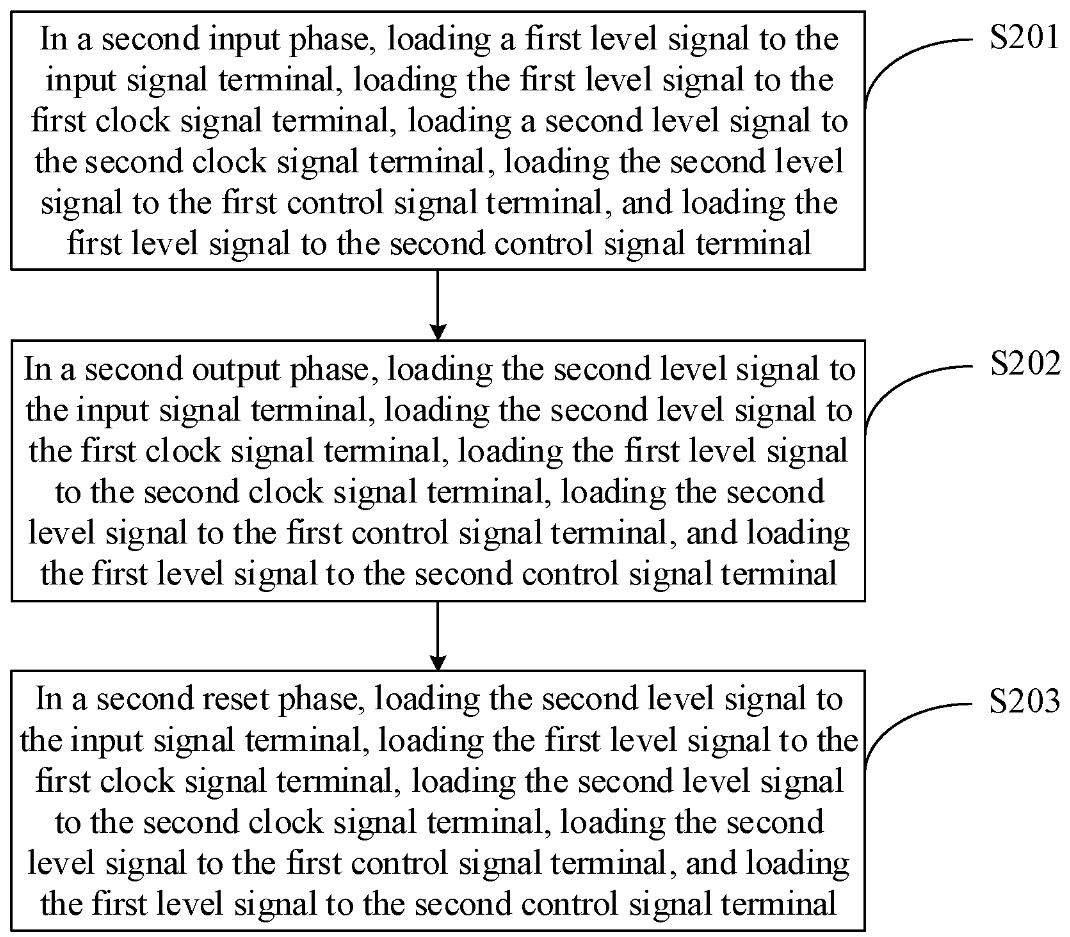
FIG. 6 is a flow diagram of a driving method of some other shift register units provided in an embodiment of the present disclosure.

In specific implementation, in the embodiment of the present disclosure, as shown in FIG. 6, the driving method may include a second driving cycle. The second driving cycle may include the following steps.

In S201, in a second input phase, the first level signal is loaded to the input signal terminal, the first level signal is loaded to the first clock signal terminal, the second level signal is loaded to the second clock signal terminal, the second level signal is loaded to the first control signal terminal, and the first level signal is loaded to the second control signal terminal.

In S202, in a second output phase, the second level signal is loaded to the input signal terminal, the second level signal is loaded to the first clock signal terminal, the first level signal is loaded to the second clock signal terminal, the second level signal is loaded to the first control signal terminal, and the first level signal is loaded to the second control signal terminal.

In S203, in a second reset phase, the second level signal is loaded to the input signal terminal, the first level signal is loaded to the first clock signal terminal, the second level signal is loaded to the second clock signal terminal, the second level signal is loaded to the first control signal terminal, and the first level signal is loaded to the second control signal terminal.

In specific implementation, in the embodiment of the present disclosure, the driving method may include a first driving cycle and a second driving cycle. The first driving cycle may appear before the second driving cycle, or the second driving cycle may also appear before the first driving cycle, which is not limited here.

In specific implementation, in the first driving cycle, after the first reset phase, the method may further include a first holding phase. In the first holding phase, the input signal terminal is loaded with the second level signal, the first clock signal terminal is loaded with the second level signal, the second clock signal terminal is loaded with the first level signal, the first control signal terminal is loaded with the first level signal, and the second control signal terminal is loaded with the second level signal.

In specific implementation, in the second driving cycle, after the second reset phase, the method may further include a second holding phase. In the second holding phase, the input signal terminal is loaded with the second level signal, the first clock signal terminal is loaded with the second level signal, the second clock signal terminal is loaded with the first level signal, the first control signal terminal is loaded with the second level signal, and the second control signal terminal is loaded with the first level signal.

Optionally, in the above driving method of the shift register unit provided in the embodiment of the present disclosure, as shown in FIG. 3, the first level signal may be a low-level signal, and correspondingly the second level signal is a high-level signal; or conversely, the first level signal may also be a high-level signal, and correspondingly the second level signal is a low-level signal, specifically depending on whether the transistor is an N-type transistor or a P-type transistor, which is not limited here.

Figure 7:
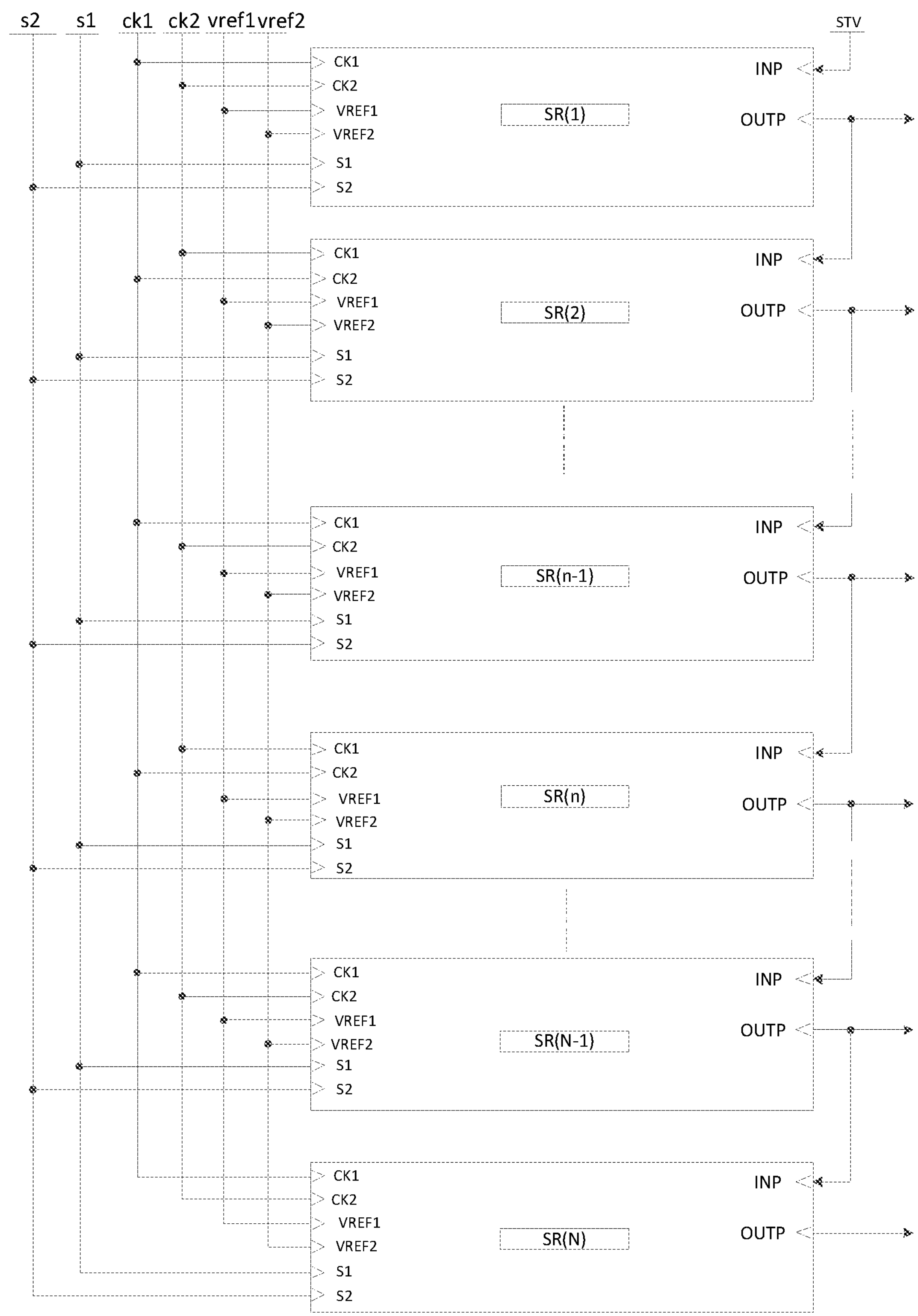
FIG. 7 is a schematic structural diagram of a gate drive circuit provided in an embodiment of the present disclosure.

Based on the same inventive concept, an embodiment of the present disclosure also provides a gate drive circuit. As shown in FIG. 7, the gate drive circuit includes a plurality of cascaded shift register units SR (1), SR (2) . . . SR (n−1), SR (n) . . . SR (N−1), SR (N) (a total of N shift register units, 1≤n≤N) provided in above embodiments of the present disclosure, wherein an input signal terminal INP of a shift register unit SR (1) of a first stage is configured to be coupled to a frame trigger signal terminal STV; and in every two adjacent shift register units, an input signal terminal INP of a shift register unit SR(n) of a following stage is coupled to a signal output terminal OUTP of a shift register unit SR(n−1) of a previous stage.

Specifically, the structure of each shift register unit in the above gate drive circuit is functionally and structurally same as the above shift register unit of the present disclosure, and repeated description is omitted. The gate drive circuit may be arranged in a liquid crystal display panel or may also be arranged in an electroluminescent display panel, which is not limited here.

Specifically, in the above gate drive circuit provided in the embodiment of the present disclosure, as shown in FIG. 7, the first reference signal terminal VREF1 of shift register unit SR (n) of each stage is coupled to the same first DC signal terminal vref1, and the second reference signal terminal VREF2 of the shift register unit SR (n) of each stage is coupled to the same second DC signal terminal vref2.

Specifically, in the above gate drive circuit provided in the embodiment of the present disclosure, as shown in FIG. 7, a first clock signal terminal CK1 of a shift register unit of a (2k−1)-th stage and a second clock signal terminal CK2 of a shift register unit of a 2k-th stage are coupled to the same clock terminal, i.e. a first clock terminal ck1; and a second clock signal terminal CK2 of the shift register unit of the (2k−1)-th stage and a first clock signal terminal CK1 of the shift register unit of the 2k-th stage are coupled to the same clock terminal, i.e. a second clock terminal ck2, where k is a positive integer.

In specific implementation, in the embodiment of the present disclosure, the first control signal terminal of the shift register unit of each stage is coupled to the same first control terminal. The second control signal terminal of the shift register unit of each stage is coupled to the same second control terminal.

Based on the same inventive concept, an embodiment of the present disclosure also provides a display device, including the above gate drive circuit provided in the embodiment of the present disclosure. The problem-solving principle of the display device is similar to that of the above shift register unit, and thus, for the implementation of the display device, reference may be made to the implementation of the above shift register unit, and repeated description is omitted.

Figure 8:
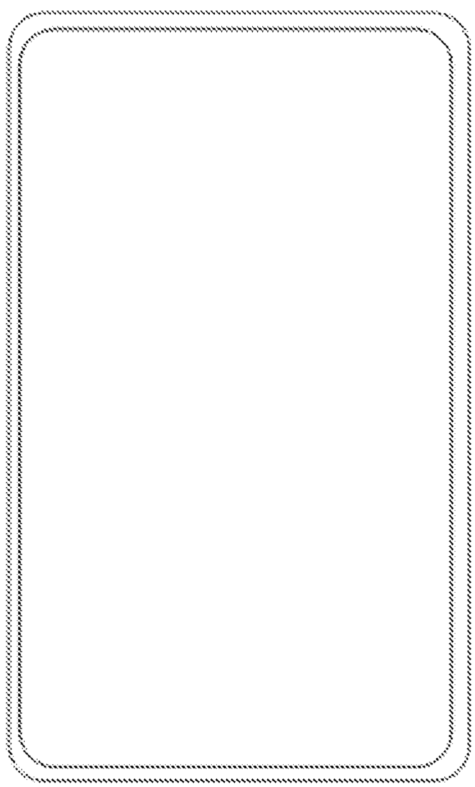
FIG. 8 is a schematic structural diagram of a display device provided in an embodiment of the present disclosure.

In specific implementation, the above display device provided in the embodiment of the present disclosure may be a mobile phone as shown in FIG. 8. Of course, the above display device provided in the embodiment of the present disclosure may also be a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure.

Embodiments of the present disclosure provide a shift register unit, a driving method thereof, and a device. The shift register unit may include: an input circuit, a node control circuit, a first control output circuit, a second control output circuit, and an output circuit. By providing the first control output circuit and the second control output circuit, the first control output circuit and the second control output circuit may operate alternately, so that the first control output circuit and the second control output circuit may have time for characteristics recovery respectively, thus improving the service life and output stability of the shift register unit.

The preferred embodiments of the present disclosure are described above; however, once those skilled in the art get the basic inventive concepts, they can make additional variations and modifications to these embodiments. Therefore, the appended claims are intended to be interpreted as including the preferred embodiments and all variations and modifications falling into the scope of the present disclosure.

Evidently those skilled in the art can make various modifications and variations to the invention without departing from the spirit and scope of the invention. Thus the invention is also intended to encompass these modifications and variations therein as long as these modifications and variations come into the scope of the claims of the invention and their equivalents.

What is claimed is:

1. A shift register unit, comprising:

an input circuit configured to provide a signal of an input signal terminal to a first node in response to a signal of a first clock signal terminal; and provide a signal of a first reference signal terminal to a second node in response to the signal of the first clock signal terminal;

a node control circuit, connected with the first node, the second node and the first clock signal terminal respectively, wherein the node control circuit is configured to provide the signal of the first clock signal terminal to the second node in response to a signal of the first node;

a first control output circuit configured to control a signal of a third node according to a signal of a first control signal terminal and a signal of the second node;

a second control output circuit configured to provide a signal of a second reference signal terminal to a signal output terminal according to a signal of a second control signal terminal and the signal of the second node; and an output circuit configured to provide a signal to the signal output terminal according to the signal of the first node;

wherein the output circuit comprises a ninth transistor, a tenth transistor and a first capacitor, the ninth transistor has a gate electrode coupled to the first reference signal terminal, a first electrode coupled to the first node, and a second electrode coupled to a gate electrode of tenth transistor; the tenth transistor has a first electrode coupled to the second clock signal terminal, and a second electrode coupled to the signal output terminal; and the first capacitor is coupled between the gate of the tenth transistor and the signal output terminal;

or, wherein the output circuit comprises an eleventh transistor, a twelfth transistor, a thirteenth transistor and a second capacitor; wherein the eleventh transistor has a gate electrode coupled to the first control signal terminal, a first electrode coupled to the first node, and a second electrode coupled to a gate electrode of the thirteenth transistor; the twelfth transistor has a gate coupled to the second control signal terminal, a first electrode coupled to the first node, and a second electrode coupled to the gate of the thirteenth transistor; the thirteenth transistor has a first electrode coupled to the second clock signal terminal, and a second electrode coupled to the signal output terminal; and the second capacitor is coupled between the gate of the thirteenth transistor and the signal output terminal.

2. The shift register unit according to claim 1, wherein the first control output circuit comprises a first sub-circuit;

the first sub-circuit is configured to connect the second node with a fourth node in response to the signal of the first control signal terminal.

3. The shift register unit of claim 2, wherein the first sub-circuit comprises a first transistor; and the first transistor has a gate electrode coupled to the first control signal terminal, a first electrode coupled to the second node, and a second electrode coupled to the fourth node.

4. The shift register unit according to claim 1, wherein the first control output circuit comprises a second sub-circuit;

the second sub-circuit is configured to provide the signal of the second reference signal terminal to a fifth node in response to the signal of the first control signal terminal.

5. The shift register unit according to claim 4, wherein the second sub-circuit comprises a second transistor; and the second transistor has a gate electrode coupled to the first control signal terminal, a first electrode coupled to the second reference signal terminal, and a second electrode coupled to the fifth node.

6. The shift register unit according to claim 1, wherein the first control output circuit comprises a third sub-circuit;

the third sub-circuit is configured to provide the signal of the second reference signal terminal to the third node and the signal output terminal respectively in response to a signal of a fourth node; and the third sub-circuit comprises a third transistor and a fourth transistor;

the third transistor has a gate electrode coupled to the fourth node, a first electrode coupled to the second reference signal terminal, and a second electrode coupled to the third node; and the fourth transistor has a gate electrode coupled to the fourth node, a first electrode coupled to the second reference signal terminal, and a second electrode coupled to the signal output terminal.

7. The shift register unit according to claim 1, wherein the second control output circuit comprises a fourth sub-circuit;

the fourth sub-circuit comprises a fifth transistor; and the fifth transistor has a gate electrode coupled to the second control signal terminal, a first electrode coupled to the second node, and a second electrode coupled to the fifth node.

8. The shift register unit according to claim 1, wherein the second control output circuit comprises a fourth sub-circuit, a fifth sub-circuit and a sixth sub-circuit; and the fourth sub-circuit is configured to connect the second node with a fifth node in response to the signal of the second control signal terminal;

the fifth sub-circuit is configured to provide the signal of the second reference signal terminal to a fourth node in response to the signal of the second control signal terminal; and the sixth sub-circuit is configured to provide the signal of the second reference signal terminal to the third node and the signal output terminal respectively in response to a signal of the fifth node.

9. The shift register unit of claim 8, wherein the fourth sub-circuit comprises a fifth transistor, and the fifth transistor has a gate electrode coupled to the second control signal terminal, a first electrode coupled to the second node, and a second electrode coupled to the fifth node;

the fifth sub-circuit comprises a sixth transistor; and the sixth transistor has a gate electrode coupled to the second control signal terminal, a first electrode coupled to the second reference signal terminal, and a second electrode coupled to the fourth node; and the sixth sub-circuit comprises a seventh transistor and an eighth transistor; and the seventh transistor has a gate electrode coupled to the fifth node, a first electrode coupled to the second reference signal terminal, and a second electrode coupled to the third node; and the eighth transistor has a gate electrode coupled to the fifth node, a first electrode coupled to the second reference signal terminal, and a second electrode coupled to the signal output terminal.

10. The shift register unit according to claim 1, wherein the twelfth transistor is configured to provide a signal output from the input circuit to the gate electrode of the thirteenth transistor; and the second control signal terminal is different from the first clock signal terminal.

11. The shift register unit according to claim 1, wherein the node control circuit comprises a fourteenth transistor; and the fourteenth transistor has a gate electrode coupled to the first node, a first electrode coupled to the first clock signal terminal, and a second electrode coupled to the second node.

12. The shift register unit according to claim 1, wherein the node control circuit is further connected with the third node and a second clock signal terminal; and the node control circuit is further configured to provide a signal output from the input circuit to the third node.

13. The shift register unit according to claim 12, wherein the node control circuit comprises a fifteenth transistor; and the fifteenth transistor has a gate electrode coupled to the second clock signal terminal, a first electrode coupled to the third node, and a second electrode coupled to the first node.

14. The shift register unit according to claim 1, wherein the input circuit comprises a sixteenth transistor and a seventeenth transistor; and the sixteenth transistor has a gate electrode coupled to the first clock signal terminal, a first electrode coupled to the input signal terminal, and a second electrode coupled to the first node; and the seventeenth transistor has a gate electrode coupled to the first clock signal terminal, a first electrode coupled to the first reference signal terminal, and a second electrode coupled to the second node.

15. The shift register unit according to claim 1, wherein the shift register unit further comprises a third capacitor; and the third capacitor is coupled between a fifth node and the second reference signal terminal.

16. A gate drive circuit, comprising a plurality of cascaded shift register units according to claim 1, wherein:

an input signal terminal of a first-stage shift register unit is coupled to a frame trigger signal terminal; and in every two adjacent shift register units, an input signal terminal of a shift register unit of a next stage is coupled to a signal output terminal of a shift register unit of a previous stage.

17. A display device, comprising the gate drive circuit according to claim 16.

18. A driving method of a shift register unit according claim 1, comprising a first driving cycle and/or a second driving cycle;

wherein in the first driving cycle, the driving method comprises:

in a first input phase, loading a first level signal to the input signal terminal, loading the first level signal to the first clock signal terminal, loading a second level signal to the second clock signal terminal, loading the first level signal to the first control signal terminal, and loading the second level signal to the second control signal terminal;

in a first output phase, loading the second level signal to the input signal terminal, loading the second level signal to the first clock signal terminal, loading the first level signal to the second clock signal terminal, loading the first level signal to the first control signal terminal, and loading the second level signal to the second control signal terminal; and in a first reset phase, loading the second level signal to the input signal terminal, loading the first level signal to the first clock signal terminal, loading the second level signal to the second clock signal terminal, loading the first level signal to the first control signal terminal, and loading the second level signal to the second control signal terminal; and in the second driving cycle, the method comprises:

in a second input phase, loading the first level signal to the input signal terminal, loading the first level signal to the first clock signal terminal, loading the second level signal to the second clock signal terminal, loading the second level signal to the first control signal terminal, and loading the first level signal to the second control signal terminal;

in a second output phase, loading the second level signal to the input signal terminal, loading the second level signal to the first clock signal terminal, loading the first level signal to the second clock signal terminal, loading the second level signal to the first control signal terminal, and loading the first level signal to the second control signal terminal; and in a second reset phase, loading the second level signal to the input signal terminal, loading the first level signal to the first clock signal terminal, loading the second level signal to the second clock signal terminal, loading the second level signal to the first control signal terminal, and loading the first level signal to the second control signal terminal, wherein the first level signal is a low level signal and the second level signal is a high level signal.

* * * * *